United States Patent
Ho et al.

(10) Patent No.: US 7,969,225 B2
(45) Date of Patent: Jun. 28, 2011

(54) CIRCUIT OF REDUCING POWER LOSS OF SWITCHING DEVICE

(75) Inventors: Yuan-Hsiang Ho, Zhonghe (TW);
Yung-Ruei Chang, Xindian (TW);
Jih-Sheng Lai, Blacksburg, VA (US)

(73) Assignee: Atomic Energy Council-Institute of Nuclear Energy Research, Taoyuan (TW)

( * ) Notice: Subject to any disclaimer, the term of this patent is extended or adjusted under 35 U.S.C. 154(b) by 0 days.

(21) Appl. No.: 12/701,376

(22) Filed: Feb. 5, 2010

(65) Prior Publication Data
US 2011/0057716 A1 Mar. 10, 2011

(30) Foreign Application Priority Data
Sep. 10, 2009 (TW) .............................. 98130509 A

(51) Int. Cl.
*H03K 17/56* (2006.01)

(52) U.S. Cl. ........................................ 327/423; 327/110
(58) Field of Classification Search .................. 327/434, 327/423, 587, 588, 110, 111
See application file for complete search history.

(56) References Cited

U.S. PATENT DOCUMENTS

| | | | |
|---|---|---|---|
| 6,121,800 A * | 9/2000 | Leighton et al. | 327/110 |
| 6,353,354 B1 * | 3/2002 | Detweiler et al. | 327/423 |
| 6,545,514 B2 * | 4/2003 | Barrow | 327/110 |
| 7,592,852 B2 * | 9/2009 | Hsieh et al. | 327/423 |

* cited by examiner

*Primary Examiner* — Hai L Nguyen
(74) *Attorney, Agent, or Firm* — Lee & Hayes, PLLC

(57) ABSTRACT

A circuit is provided to reduce power loss on switching. A pair of auxiliary switching devices is switched on before a pair of switching devices. The switching devices are switched on after a corresponding capacitor to the auxiliary switching devices is discharged to zero. Thus, the power loss of the switching devices is reduced.

12 Claims, 11 Drawing Sheets

CIRCUIT OF REDUCING POWER LOSS OF SWITCHING DEVICE

CROSS REFERENCE TO RELATED PATENT APPLICATIONS

This application claims priority from Taiwan Patent Application No. 098130509, filed in the Taiwan Patent Office on Sep. 10, 2009, entitled "Circuit of Reducing Power Loss of Switching Device" and incorporates the Taiwan patent application in its entirety by reference.

TECHNICAL FIELD

The present disclosure relates to reducing power loss; more particularly, relates to drive a load by a switching inverter connected with a high-voltage direct-current (DC) bus while power loss happened between turning on and off metal-oxide semiconductor field-effect transistor (MOSFET) is reduced.

DESCRIPTION OF THE RELATED ARTS

Generally, a power system having a low voltage and a big current raises its voltage level to reduce current for decreasing power loss, while the power system having the raised voltage output power through a switching inverter composed of switches. Although the power loss is thus reduced, the switches still have switching loss and efficiency of the whole system is not well improved.

In FIG. 6, a general switching inverter 4 comprises two pairs of switching devices 5, 6 and an alternative-current (AC) inductor 7, where the switching devices 5, 6 and the AC inductor 7 are serially connected. Therein, the first switching device 5 comprises a first switch 51 and a second switch 52; the second switching device 6 comprises a third switch 53 and a fourth switch 54; the first switch 51 and the second switch 52 are serially connected with each other; and, the third switch 53 and the fourth switch 54 are serially connected with each other. The disadvantage of such a switching inverter is a high switching loss on turning on and off transistor. When a drain-source voltage (Vs.) of any switching device 5,6 is not reduced to zero, a current is generated to flow through the switching device 5,6 so that a switching loss is happened to the switching device 5,6. As a result, quality of the device is affected, electronic utilities around are interfered, and power source becomes not reliable. Hence, the prior arts do not fulfill all users' requests on actual use.

SUMMARY OF THE DISCLOSURE

The main purpose of the present disclosure is to drive a load by a switching inverter connected with a high voltage DC bus while power loss happened between turning on and off MOSFET is reduced.

To achieve the above purpose, the present disclosure is a circuit of reducing power loss of a switching device, comprising a pair of auxiliary switching devices, a pair of diodes, a pair of switching devices, a pair of auxiliary inductors and a load circuit, where top leg auxiliary switches and bottom leg auxiliary switches of the auxiliary switching devices are turned on earlier than top leg switches and bottom leg switches of the switching devices after a drain-source voltage of a parallel capacitor of a corresponding MOSFET is totally discharged. Accordingly, a novel circuit of reducing power loss of a switching device is obtained.

BRIEF DESCRIPTION OF THE DRAWINGS

The present disclosure will be better understood from the following detailed description of the preferred embodiment according to the present disclosure, taken in conjunction with the accompanying drawings, in which.

DESCRIPTION OF THE PREFERRED EMBODIMENT

The following description of the preferred embodiment is provided to understand the features and the structures of the present disclosure.

Figure 1:
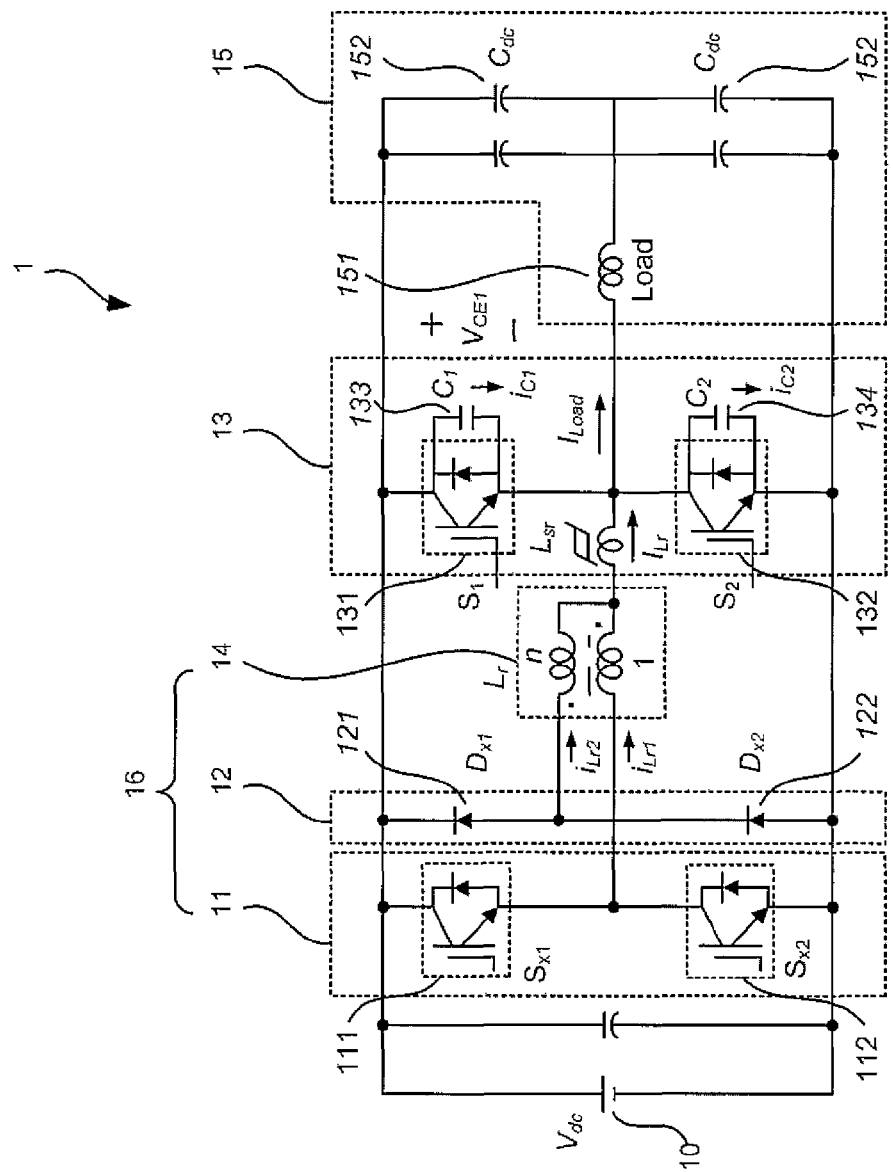
FIG. 1 is the view showing the preferred embodiment according to the present disclosure.
Figure 2:
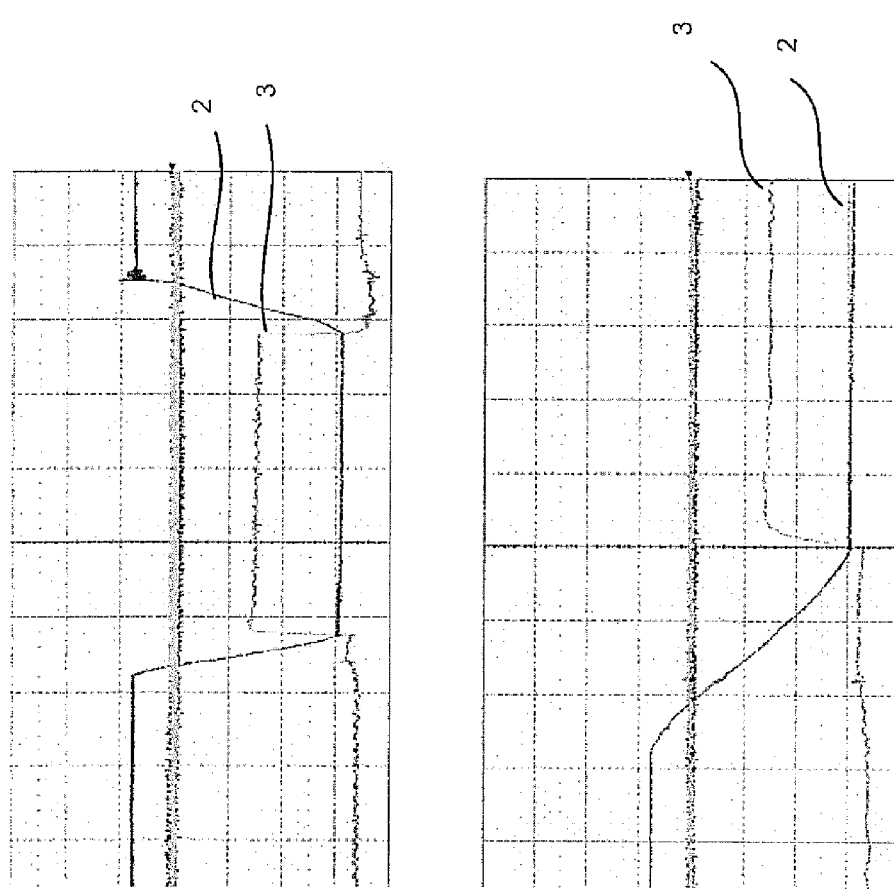
FIG. 2 is the view showing the switching loss.
Figure 3A:
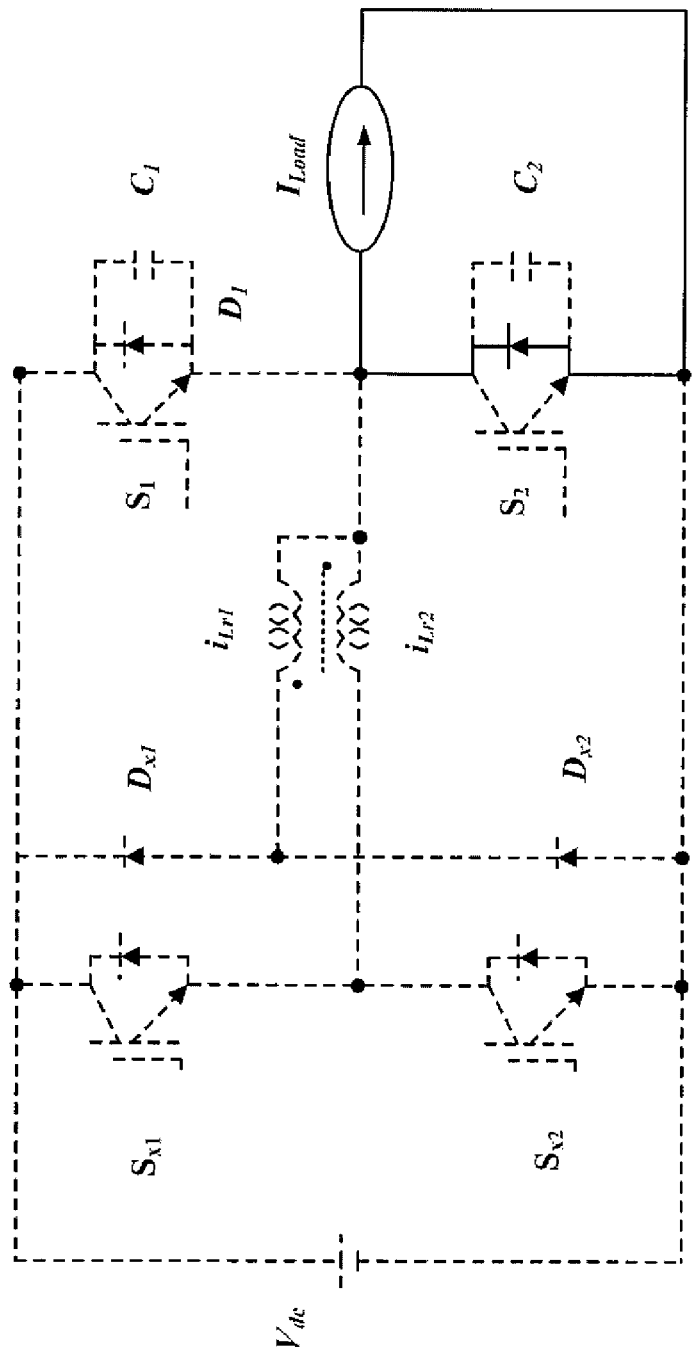
FIG. 3A to FIG. 3F are the views showing the time series control modes of the circuit.
Figure 3B:
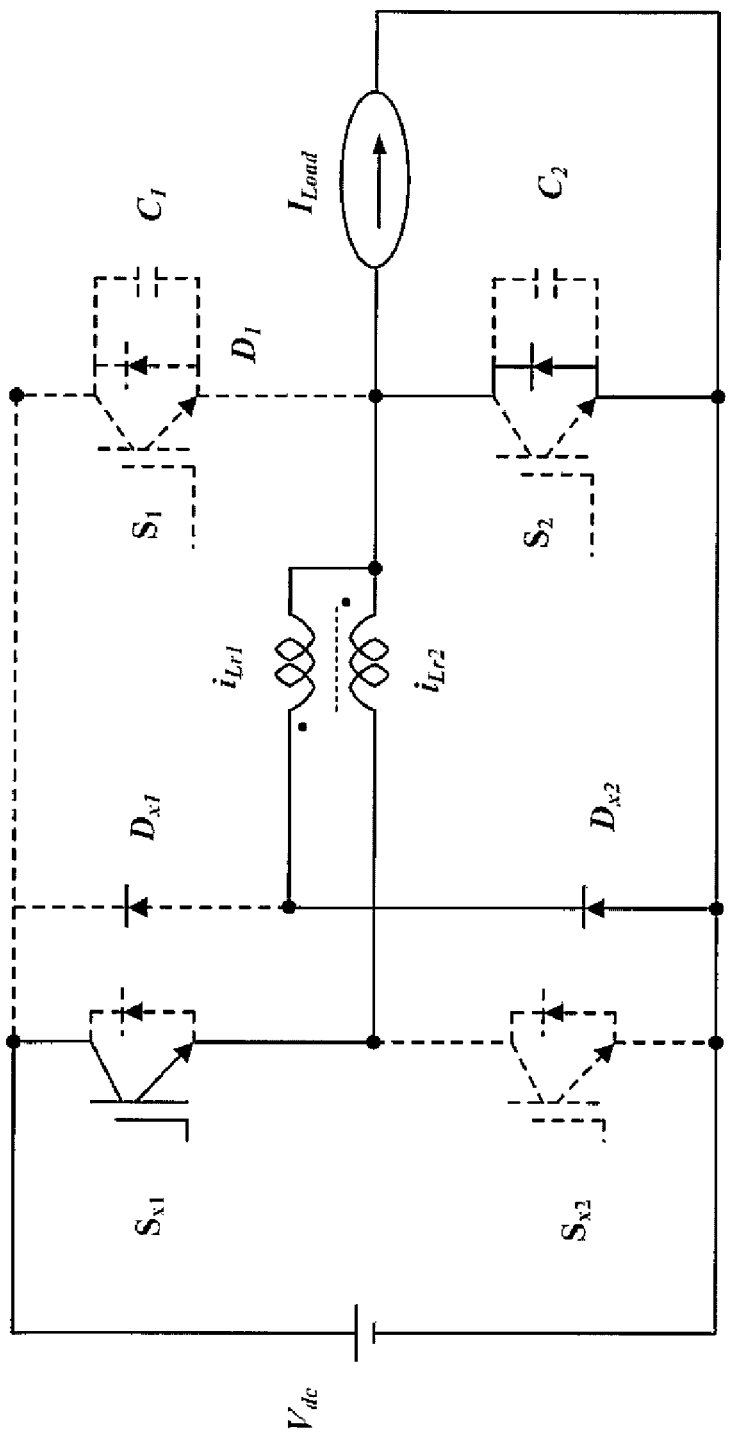
Figure 3C:
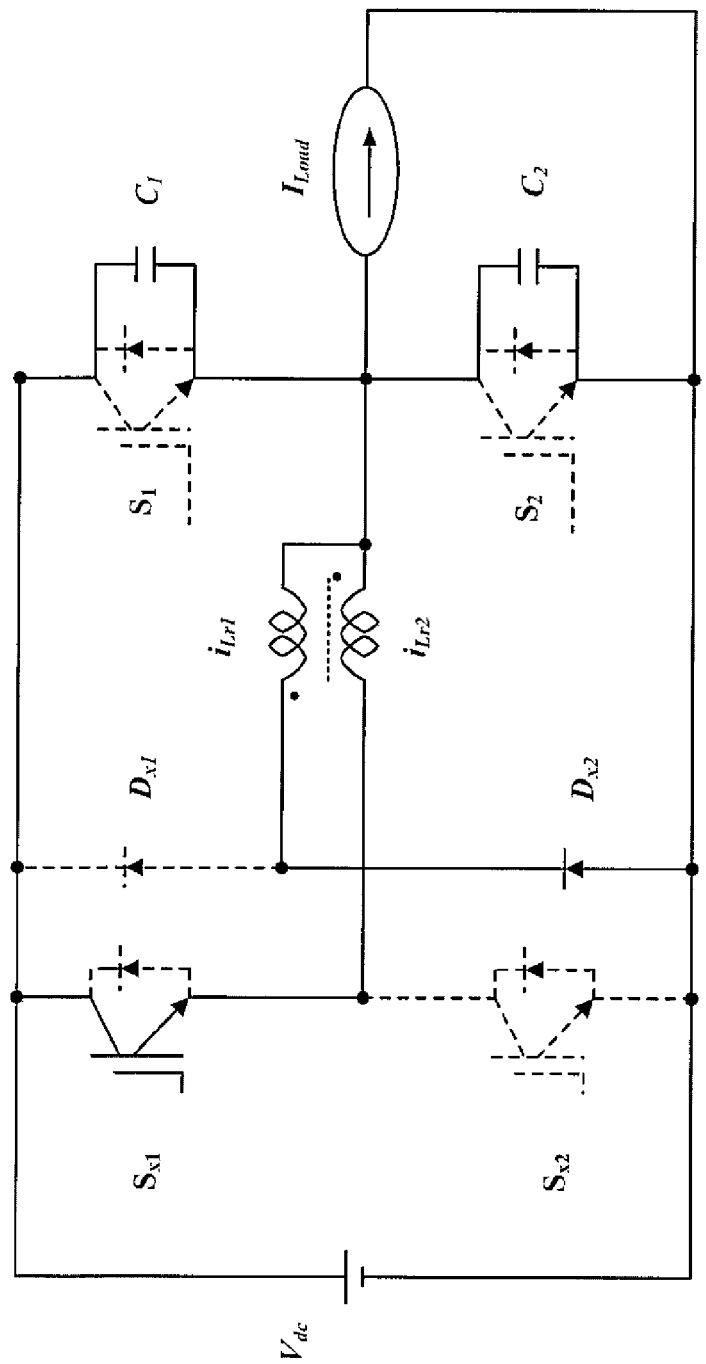
Figure 3D:
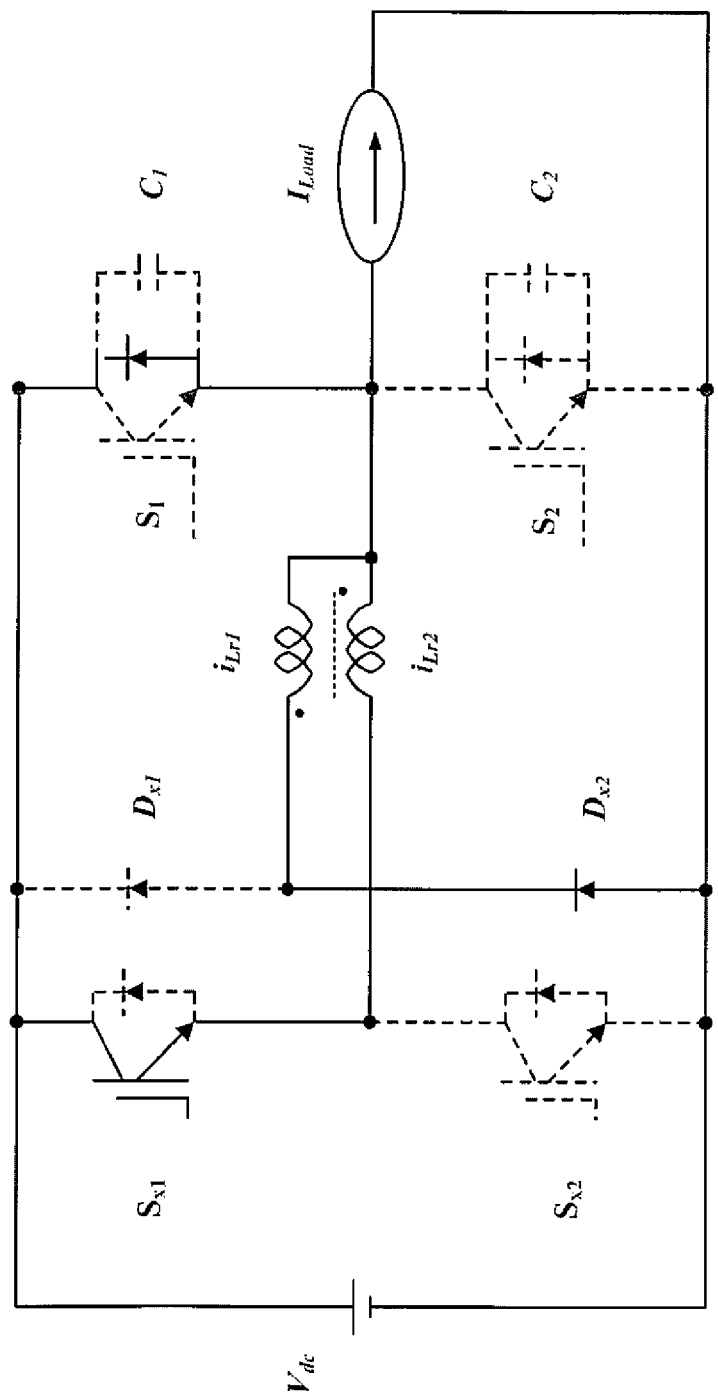
Figure 3E:
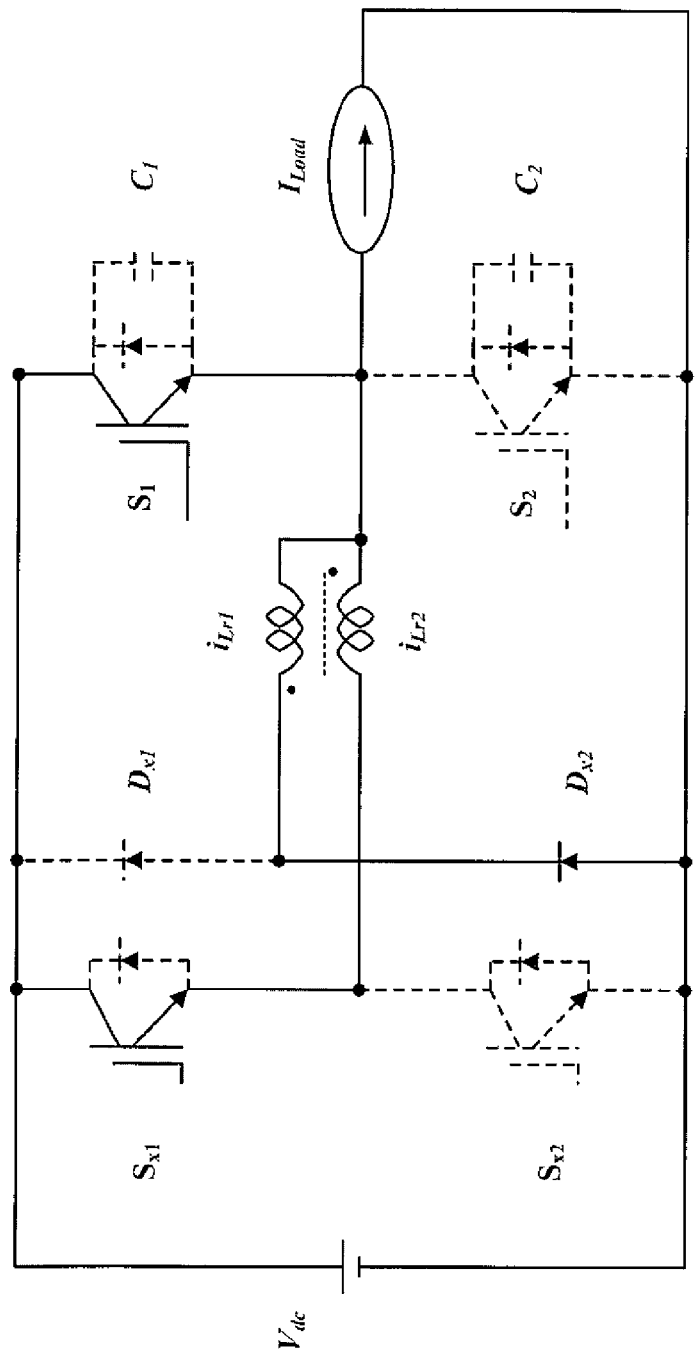
Figure 3F:
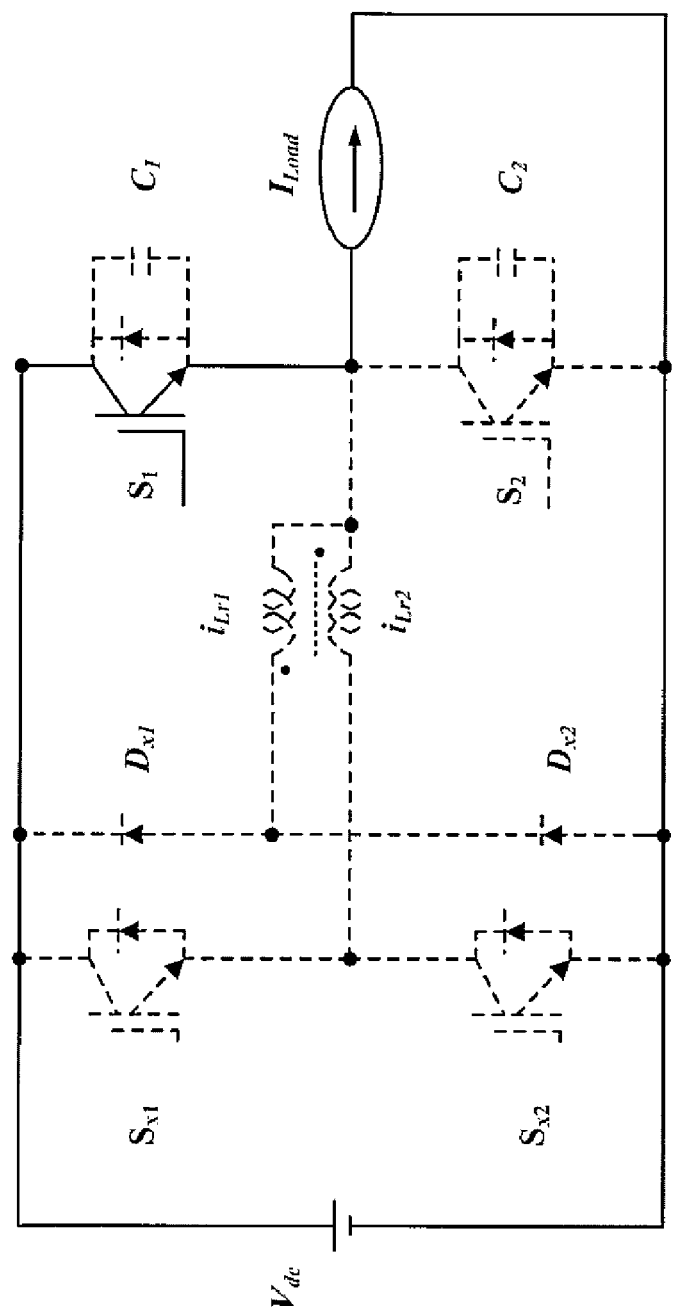

Please refer to FIG. 1 and FIG. 2, which are a view showing a preferred embodiment according to the present disclosure and a view showing switching loss. As shown in the figures, the present disclosure is a circuit of reducing power loss of a switching device, comprising a pair of auxiliary switching devices 11, a pair of diodes 12, a pair of switching devices 13, a pair of auxiliary inductors 14 and a load circuit 15, where a switching inverter 1 connected with a high-voltage direct-current (DC) bus is thus constructed to drive a load.

The pair of auxiliary switching devices 11, comprising a top leg auxiliary switch 111 and a bottom leg auxiliary switch 112, is connected with a direct-current voltage 10, where the top leg auxiliary switch 111 and the bottom leg auxiliary switch 112 are serially connected with each other; and each of the top leg auxiliary switch 111 and the bottom leg auxiliary switch 112 is an auxiliary metal-oxide semiconductor field-effect transistor (MOSFET).

The pair of diodes 12, comprising a first diode 121 and a second diode 122, is connected with the pair of auxiliary switching devices 11.

The pair of switching devices 13 comprises a top leg switch 131 and a bottom leg switch 132, where the top leg switch 131 and the bottom leg switch 132 are serially connected with each other; each of the top leg switch 131 and the bottom leg switch 132 is a switching MOSFET; and each of the top leg switch 131 and the bottom leg switch 132 is parallelly connected with a resonant capacitor 133,134.

The pair of auxiliary inductors 14 is connected with the pair of auxiliary switching devices 11 and the pair of switching devices 13. An auxiliary switching circuit 16 is constructed with the pair of auxiliary inductors 14, the pair of auxiliary switching devices 11 and the pair of diodes 12 to fix each turn-on time of the top leg auxiliary switch 111 and the bottom leg auxiliary switch 112. Therein, the pair of auxiliary inductors 14 comprises a first inductor and a second inductor; the first inductor and the second inductor are parallelly connected with each other; each of the first inductor and the second inductor has a first terminal and a second terminal; and, the second terminal of the second inductor is connected with the second terminal of the first inductor.

The load circuit 15, comprising a load inductor 151 and a plurality of load capacitors 152, is connected with the pair of switching devices 13.

On constructing the present disclosure, an auxiliary transformer is constructed with the first inductor and the second inductor of the auxiliary inductor 14; a ratio of a coil number of a secondary side of the auxiliary transformer to a coil number of a primary side of the auxiliary transformer is 1:n; the first diode 121 and the second diode 122 are connected with each other at a point through a terminal of the first diode 121 and a terminal of the second diode 122; the first diode 121 and the second diode 122 are connected with the first terminal of the first inductor; the first terminal of the second inductor is connected with a common terminal of the pair of auxiliary switching devices 11; the second terminal of the second inductor is connected with a common terminal of the pair of switching devices 13; the common terminal of the pair of switching devices 13 is connected with the load inductor 151; and, the load capacitor 152 of the load circuit 15 is connected with the load inductor 151 through a terminal of the load capacitor 152. Therein, the first diode 121 and the second diode 122 are connected with the top leg auxiliary switch 111, the bottom leg auxiliary switch 112, the top leg switch 131 and the bottom leg switch 132 through another terminal of the first diode 121 and another terminal of the second diode 122; and, the load capacitor 152 of the load circuit 15 is connected with the top leg switch 131 and the bottom leg switch 132 through another terminal of the load capacitor 152. Thus, a novel circuit of reducing power loss of a switching device is obtained.

On using the present disclosure, whose switching power characteristics are shown in FIG. 2, a gate-source voltage (Vs.) 3 is turned on to let a current flow through the pair of switching devices 13 when a drain-source voltage (Vs.) 2 of the pair of switching devices 13 is reduced to zero. Thus, switching loss of the pair of switching devices 13 is reduced.

Please refer to FIG. 3A to FIG. 3F, which are views showing time series control modes of the circuit. As shown in the figures, each leg of a circuit has an additional switch and the modes of time series control are shown. Significant modes include the modes shown in FIG. 3B and FIG. 3C, where soft switching is formed by turning-on a top leg auxiliary switch 111 before turning-on a top leg switch 131 after electricity (Vs.) in parallel capacitor 133 of the top leg switch 131 is totally discharged.

Figure 4:
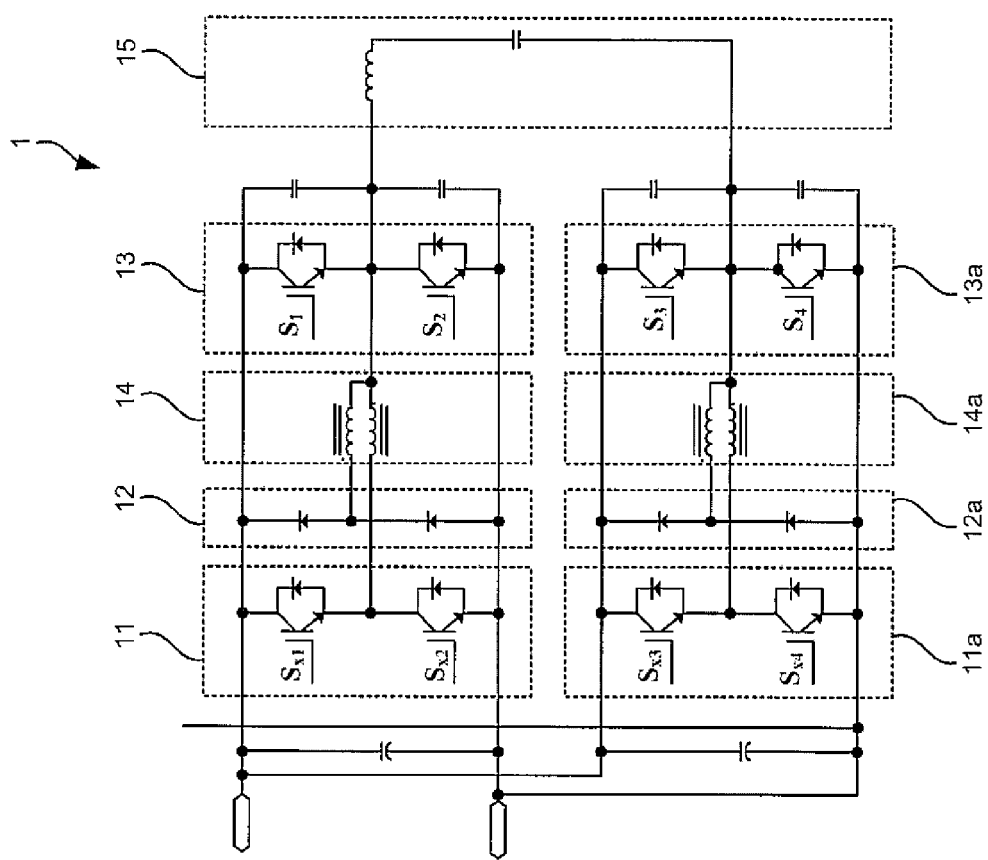
FIG. 4 is the view showing the state of use.
Figure 5:
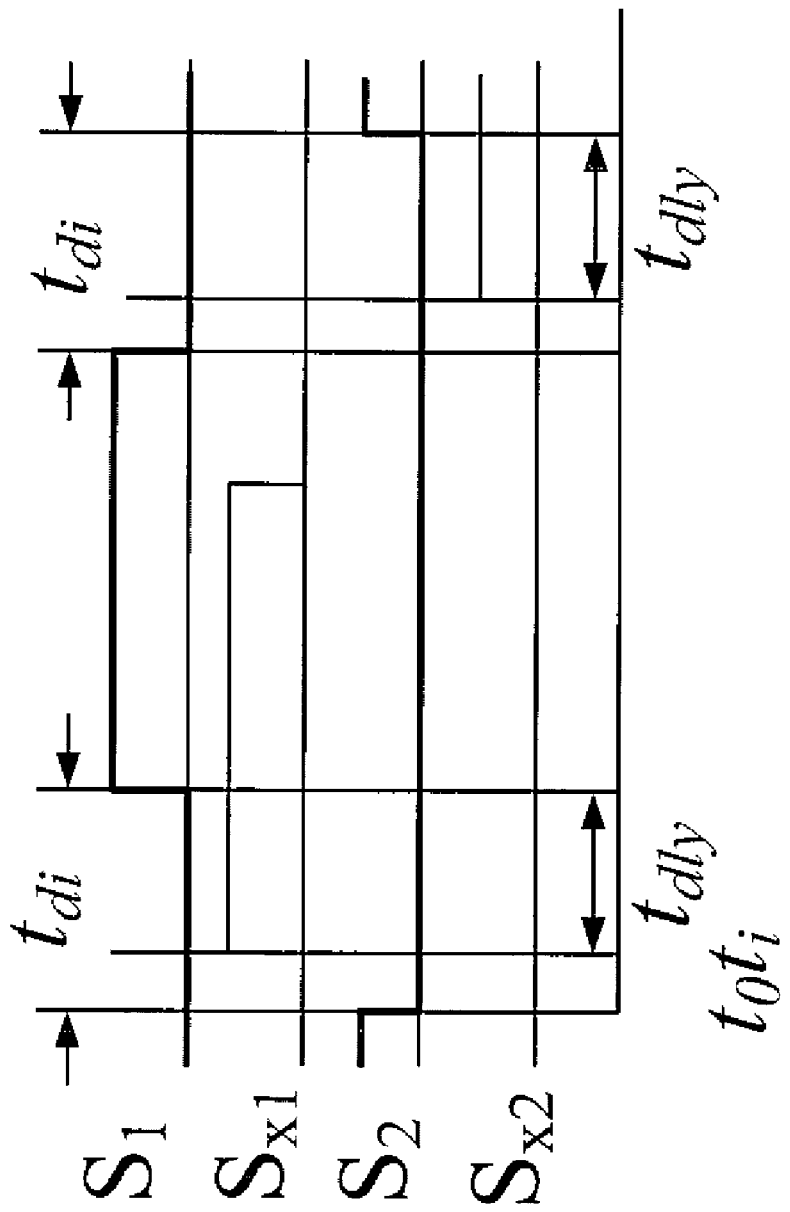
FIG. 5 is the view showing the time series control.
Figure 6:
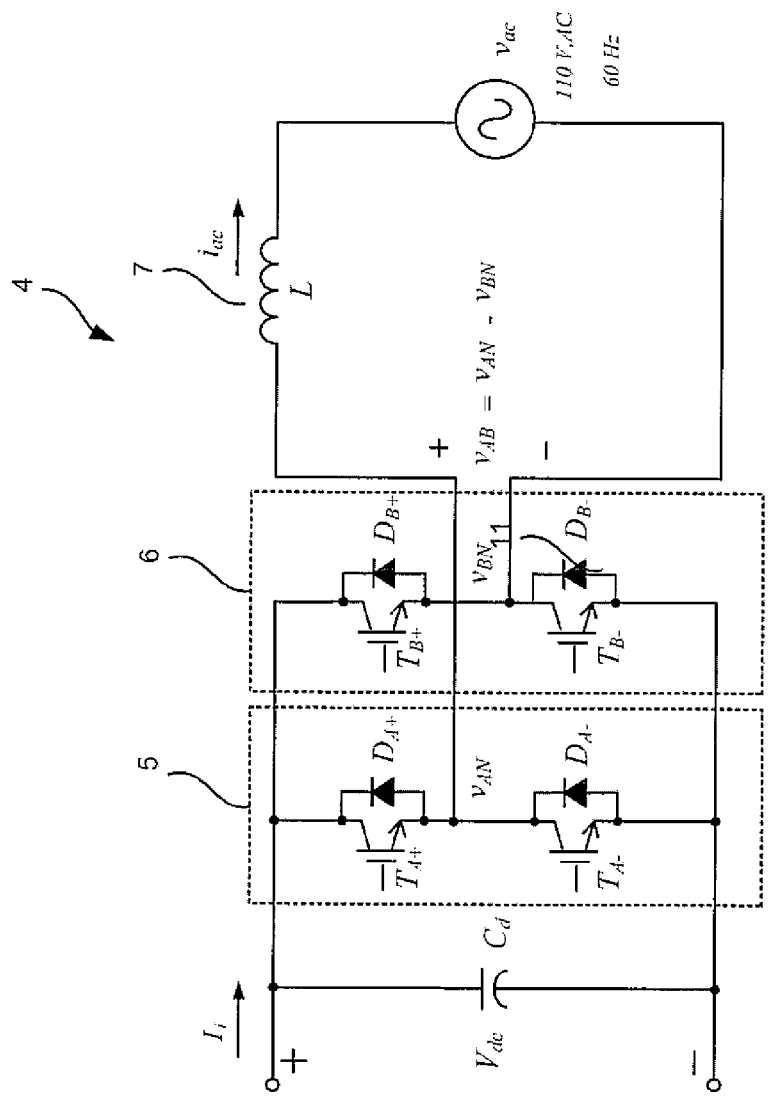
FIG. 6 is the view of the prior art.

Please refer to FIG. 4 and FIG. 5, which is a view showing the state of use and a view showing time series control. As shown in the figures, a pair of auxiliary switching devices 11, a pair of diodes 12, a pair of switching devices 13, a pair of auxiliary inductors 14 and a load circuit 15 are parallelly connected with another pair of auxiliary switching devices 11a, another pair of diodes 12a, another pair of switching devices 13a, another pair of auxiliary inductors 14a and another load circuit 15a.

Therein, control signals of MOSFETs are shown in FIG. 5, where top leg auxiliary switches 111,111a and bottom leg auxiliary switches 112,112a of the auxiliary switching devices 11,11a are turned-on earlier than top leg switches 131,131a and bottom leg switches 132,132a of the switching devices 13,13a after a Vs. of a parallel capacitor of a corresponding MOSFET is totally discharged.

Thus, the present disclosure reduces power loss on switching where an additional switch is used on each leg to reduce switching loss between turning on and off MOSFET.

To sum up, the present disclosure is a circuit of reducing power loss of a switching device, where power loss happened between turning on and off MOSFET is reduced by applying an additional switch on each leg.

The preferred embodiment herein disclosed is not intended to unnecessarily limit the scope of the disclosure. Therefore, simple modifications or variations belonging to the equivalent of the scope of the claims and the instructions disclosed herein for a patent are all within the scope of the present disclosure.

What is claimed is:

1. A circuit of reducing power loss of a switching device, comprising:

a pair of auxiliary switching devices, said pair of auxiliary switching devices being connected to a direct voltage, said pair of auxiliary switching devices comprising a top leg auxiliary switch and a bottom leg auxiliary switch, said top leg auxiliary switch and said bottom leg auxiliary switch being serially connected with each other, each of said top leg auxiliary switch and said bottom leg auxiliary switch being an auxiliary metal-oxide semiconductor field-effect transistor (MOSFET);

a pair of diodes, said pair of diodes being connected with said pair of auxiliary switching devices, said diodes comprising a first diode and a second diode;

a pair of switching devices, said pair of diodes comprising a top leg switch and a bottom leg switch, said top leg switch and said bottom leg switch being serially connected with each other, said top leg switch and said bottom leg switch being switching MOSFETs, each of said top leg switch and said bottom leg switch being connected with a resonant capacitor parallelly;

a pair of auxiliary inductors, said pair of auxiliary inductors being connected with said pair of auxiliary switching devices and said pair of switching devices, said pair of auxiliary inductors comprising a first inductor and a second inductor, said first inductor and said second inductor being parallelly connected with each other, each of said first inductor and said second inductor having a first terminal and a second terminal; and a load circuit, said load circuit being connected with said pair of switching devices, said load circuit comprising a load inductor and a plurality of load capacitors, wherein an auxiliary switching circuit comprising said pair of auxiliary inductors, said pair of auxiliary switching devices and said pair of diodes is obtained to fix each turn-on time of said top leg auxiliary switch and said bottom leg auxiliary switch, wherein, said auxiliary switching device is turned on after a drain-source voltage of a parallel capacitor of a corresponding MOSFET is totally discharged.

2. The circuit according to claim 1, wherein a common terminal of said pair of auxiliary switching devices is connected with said first terminal of said second inductor.

3. The circuit according to claim 1, wherein said first diode and said second diode are connected with each other at a point through a terminal of said first diode and a terminal of said second diode, and wherein said first diode and said second diode are connected to said first terminal of said first inductor at said point.

4. The circuit according to claim 1, wherein said first diode and said second diode are connected with said top leg auxiliary switch and said bottom leg auxiliary switch through another terminal of said first diode and another terminal of said second diode.

5. The circuit according to claim 1, wherein said first diode and said second diode are connected with said top leg switch and said bottom leg switch through another terminal of said first diode and another terminal of said second diode.

6. The circuit according to claim 1,
wherein a common terminal of said pair of switching devices is connected with said load inductor.

7. The circuit according to claim 1,
wherein said second terminal of said second inductor is connected with said second terminal of said first inductor.

8. The circuit according to claim 1,
wherein said second terminal of said second inductor is connected with a common terminal of said pair of switching devices.

9. The circuit according to claim 1,
wherein an auxiliary transformer is obtained with said first inductor and said second inductor.

10. The circuit according to claim 9,
wherein a ratio of a coil number of a secondary side of said auxiliary transformer to a coil number of a primary side of said auxiliary transformer is 1:n.

11. The circuit according to claim 1,
wherein said load capacitor of said load circuit is connected with said load inductor through a terminal of said load capacitor.

12. The circuit according to claim 1,
wherein said load capacitor of said load circuit is connected with said top leg switch and said bottom leg switch through another terminal of said load capacitor.

* * * * *